(12) United States Patent
Hadano et al.

(10) Patent No.: US 11,065,717 B2
(45) Date of Patent: Jul. 20, 2021

(54) LASER PROCESSING APPARATUS

(71) Applicant: DISCO CORPORATION, Tokyo (JP)

(72) Inventors: Yuji Hadano, Tokyo (JP); Masatoshi Nayuki, Tokyo (JP); Keiji Nomaru, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 338 days.

(21) Appl. No.: 16/157,639

(22) Filed: Oct. 11, 2018

(65) Prior Publication Data
US 2019/0111518 A1 Apr. 18, 2019

(30) Foreign Application Priority Data
Oct. 17, 2017 (JP) .............................. JP2017-201208

(51) Int. Cl.
| | |
|---|---|
| *B23K 26/142* | (2014.01) |
| *B23K 26/06* | (2014.01) |
| *H01L 21/67* | (2006.01) |
| *B23K 26/53* | (2014.01) |
| *B23K 26/146* | (2014.01) |

(52) U.S. Cl.
CPC ........ *B23K 26/142* (2015.10); *B23K 26/0648* (2013.01); *B23K 26/0665* (2013.01); *B23K 26/146* (2015.10); *B23K 26/53* (2015.10); *H01L 21/67051* (2013.01); *H01L 21/67092* (2013.01)

(58) Field of Classification Search
CPC ............................ B23K 26/142; B23K 26/146
See application file for complete search history.

(56) References Cited

U.S. PATENT DOCUMENTS

| | | | | |
|---|---|---|---|---|
| 4,681,774 | A * | 7/1987 | Halliwell ............... | H05K 3/185 427/306 |
| 7,710,582 | B2 * | 5/2010 | Koga ................. | B23K 26/0853 356/600 |
| 2003/0158543 | A1 * | 8/2003 | Van Saarloos ...... | A61F 9/00804 606/5 |

(Continued)

FOREIGN PATENT DOCUMENTS

| | | | |
|---|---|---|---|
| JP | 10305420 | A | 11/1998 |
| JP | 2002192370 | A | 7/2002 |

(Continued)

*Primary Examiner* — Leith S Shafi
*Assistant Examiner* — Nicholas R Krasnow
(74) *Attorney, Agent, or Firm* — Greer Burns & Crain, Ltd.

(57) ABSTRACT

A laser beam applying unit of a laser processing apparatus includes a laser oscillator, a condenser adapted to focus the laser beam emitted from the laser oscillator and apply the laser beam to a workpiece, and a liquid jetting apparatus disposed at a lower end portion of the condenser and adapted to jet a liquid to an upper surface of the workpiece. The liquid jetting apparatus includes: a transparent plate disposed at the lower end portion of the condenser and permitting transmission therethrough of the laser beam; a casing provided with a space defined by a ceiling wall composed of the transparent plate, side walls, and a bottom wall; an opening formed in the bottom plate, extending in a processing feeding direction, and permitting passage therethrough of the laser beam focused by the condenser; and a liquid supply section adapted to supply the liquid to the casing.

8 Claims, 5 Drawing Sheets

(56) References Cited

U.S. PATENT DOCUMENTS

| | | | |
|---|---|---|---|
| 2013/0320595 A1* | 12/2013 | Nagare | B29C 59/16 |
| | | | 264/400 |
| 2019/0111518 A1* | 4/2019 | Hadano | B23K 26/0648 |
| 2019/0126397 A1* | 5/2019 | Nomaru | B23K 26/0665 |

FOREIGN PATENT DOCUMENTS

| | | |
|---|---|---|
| JP | 2004188475 A | 7/2004 |
| JP | 2014221483 A | 11/2014 |

* cited by examiner

LASER PROCESSING APPARATUS

BACKGROUND OF THE INVENTION

Field of the Invention

The present invention relates to a laser processing apparatus for processing a plate-shaped workpiece by applying a laser beam to the workpiece.

Description of the Related Art

A wafer having a plurality of devices such as integrated circuits (ICs) and large-scale integrations (LSIs) formed on a front surface thereof partitioned by division lines (streets) is divided into individual device chips by a laser processing apparatus, and the divided device chips are used for electric apparatuses such as mobile phones, personal computers, and illumination apparatuses.

As examples of the laser processing apparatus, there are those of a type wherein a laser beam of such a wavelength as to be absorbed in a workpiece is applied to the workpiece, with a focal point of the laser beam position on a surface of the workpiece, whereby grooves serving as starting points of division are formed by ablation (see, for example, Japanese Patent Laid-open No. Hei 10-305420), those of a type wherein a laser beam of such a wavelength as to be absorbed in a workpiece is applied to the workpiece, with a focal point of the laser beam positioned in the inside of the workpiece, whereby modified layers serving as starting points of division are formed in the inside of the workpiece (see, for example, Japanese Patent No. 3408805), and those of a type wherein a laser beam of such a wavelength as to be transmitted through a workpiece is applied to the workpiece, with a focal point of the laser beam positioned in the inside of the workpiece, whereby a plurality of shield tunnels each including a minute hole extending from a front surface to a back surface of the workpiece and serving as a starting point of division and an amorphous region surrounding the minute hole are formed (see, for example, Japanese Patent Laid-open No. 2014-221483). One of these types of the laser processing apparatuses is appropriately selected according to the kind of the workpiece, processing accuracy and the like factors.

Of the above-mentioned laser processing apparatuses, that of the type of performing ablation particularly has a problem that debris (laser processing swarf) generated upon application of the laser beam to the front surface of the wafer may scatter and adheres to the surfaces of the devices formed on the wafer, thereby lowering the quality of the devices. To overcome this problem, there has been proposed a technology wherein a liquid resin permitting transmission therethrough of the laser beam used for processing is applied to the front surface of the wafer before performing the laser processing, to thereby prevent adhesion of debris, and the liquid resin is removed after performing the laser processing (see, for example, Japanese Patent Laid-open No. 2004-188475).

SUMMARY OF THE INVENTION

According to the technology described in Japanese Patent Laid-open No. 2004-188475, the coating with the liquid resin makes it possible to prevent debris from adhering the surfaces of the devices, whereby processing quality is secured. However, this technology needs the step of applying the liquid resin and the step of removing the liquid resin after the processing, and has a problem as to productivity. Further, since the liquid resin cannot be utilized repeatedly, the technology is uneconomical.

There has also been proposed a technology wherein application of a laser beam is conducted with a wafer immersed in water, to cause debris to float in the water, whereby adhesion of the debris to the surface of the wafer is prevented. In the case where the laser beam is applied to the wafer with the wafer immersed in water, however, minute bubbles are generated from that part of the wafer to which the laser beam is applied, leading to a problem that the propagation of the laser beam is obstructed by the bubbles, and desired processing cannot be achieved.

It is therefore an object of the present invention to provide a laser processing apparatus by which a laser beam can be applied to a plate-shaped workpiece to process the workpiece, while preventing the application of the laser beam to the workpiece from being obstructed.

In accordance with an aspect of the present invention, there is provided a laser processing apparatus including: a chuck table adapted to hold a plate-shaped workpiece; a laser beam applying unit adapted to apply a laser beam to the workpiece held by the chuck table to process the workpiece; and a processing feeding unit adapted to putting the chuck table and the laser beam applying unit into relative processing feeding, wherein the laser beam applying unit includes a laser oscillator adapted to emit a laser beam, a condenser adapted to focus the laser beam emitted from the laser oscillator and to thereby apply the laser beam to the workpiece held by the chuck table, and a liquid jetting apparatus disposed at a lower end portion of the condenser and adapted to jet a liquid to an upper surface of the workpiece, the liquid jetting apparatus includes: a transparent plate disposed at the lower end portion of the condenser and permitting transmission therethrough of the laser beam; a casing provided with a space defined by a ceiling wall composed of the transparent plate, side walls, and a bottom wall; an opening formed in the bottom wall, extending in a processing feeding direction, and permitting passage therethrough of the laser beam focused by the condenser; and a liquid supply section adapted to supply the liquid to the casing, and the liquid is jetted through the opening formed in the bottom wall to the workpiece and the laser beam is applied to the workpiece.

Preferably, the laser beam applying unit further includes dispersing means dispersing the laser beam emitted from the laser oscillator.

According to the present invention, since the liquid is jetted to the workpiece through the opening formed in the bottom wall and the laser beam is applied to the workpiece, a laser processing apparatus is provided wherein application of the laser beam to the workpiece is not obstructed. In addition, in the case of applying the present invention to a laser processing apparatus for performing ablation, adhesion of debris generated at the time of laser processing to devices can be restrained, and processing quality of the devices is prevented from being lowered, without coating the front surface of the wafer with a liquid resin.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
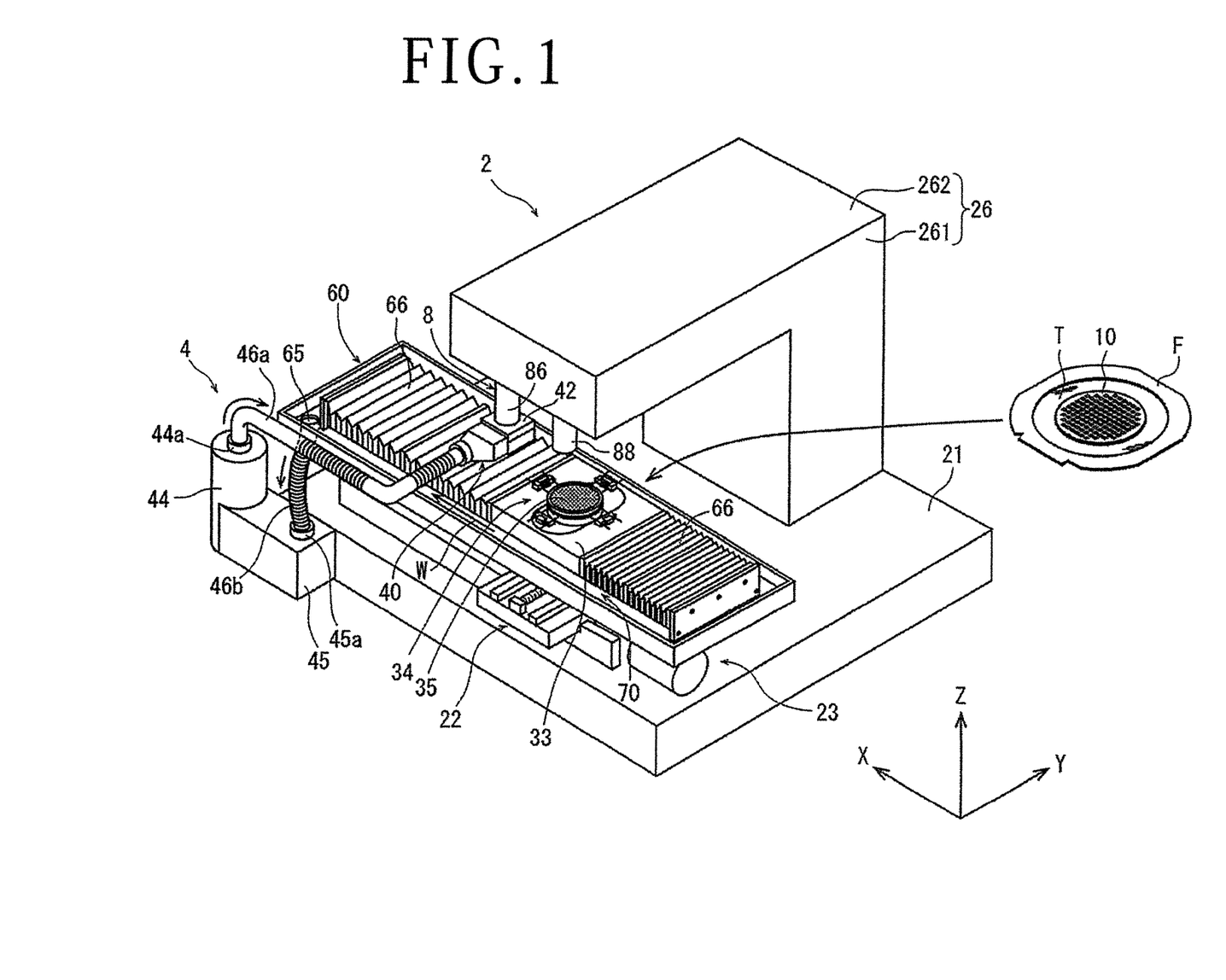
FIG. 1 is a perspective view of a laser processing apparatus according to an embodiment of the present invention.

A laser processing apparatus according to an embodiment of the present invention will be described more in detail below, referring to the attached drawings. FIG. 1 depicts a perspective view of the laser processing apparatus 2 in the present embodiment. The laser processing apparatus 2 includes: a chuck table 22 disposed on a base 21 and adapted to hold a plate-shaped workpiece (for example, a silicon wafer 10); a moving mechanism 23 adapted to move the chuck table 22; a frame body 26 composed of a vertical wall section 261 erected in a Z-direction indicated by arrow Z on a lateral side of the moving mechanism 23 on the base 21, and a horizontal wall section 262 extending in a horizontal direction from an upper end portion of the vertical wall section 261; a liquid supply mechanism 4; and a laser beam applying unit 8. As illustrated in the figure, the wafer 10 is, for example, supported by an annular frame F through an adhesive tape T, and is held by the chuck table 22. Note that in a practical processing state, the laser processing apparatus 2 as a whole is covered by a housing or the like (omitted in illustration for convenience of explanation) such that dust and the like are prevented from entering the inside of the laser processing apparatus 2.

Figure 2:
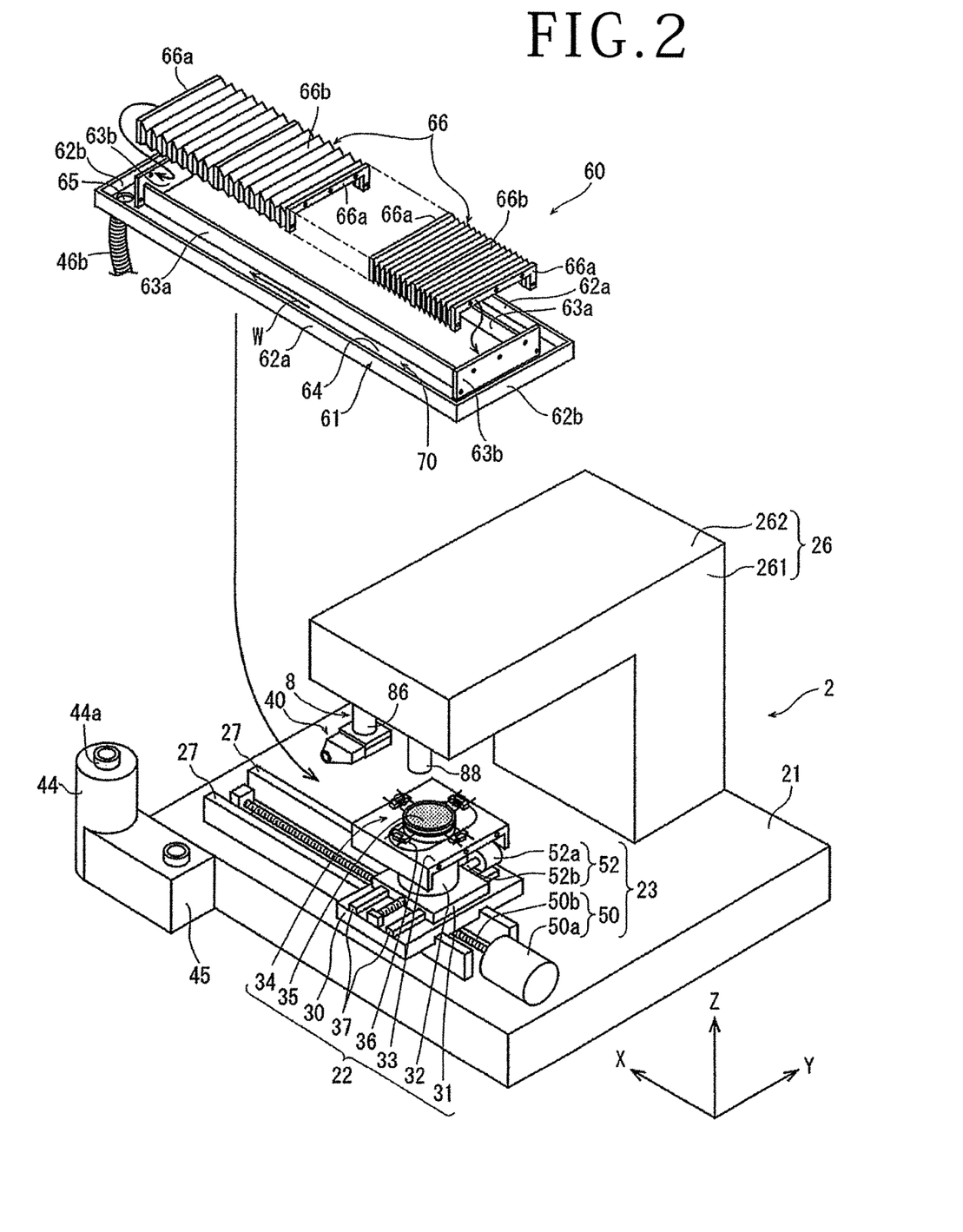
FIG. 2 is an exploded perspective view depicting the laser processing of FIG. 1, with part thereof in a dismantled state.

FIG. 2 is a perspective view depicting the laser processing apparatus 2 depicted in FIG. 1 in a state in which a liquid recovery pool 60 constituting part of the liquid supply mechanism 4 is detached from the laser processing apparatus 2 and is dismantled.

Referring to FIG. 2, the laser processing apparatus 2 according to the present embodiment will be described in detail. An optical system constituting the laser beam applying unit 8 for applying a laser beam to the wafer 10 held by the chuck table 22 is disposed inside the horizontal wall section 262 of the frame body 26. A condenser 86 constituting a part of the laser beam applying unit 8 is disposed on a lower surface side of a tip portion of the horizontal wall section 262, and an alignment unit 88 is disposed at a position adjacent to the condenser 86 in a direction indicated by arrow X.

The alignment unit 88 is provided with an imaging element (charge-coupled device (CCD)) which uses visible light beam for imaging a front surface of the wafer 10. Depending on the material constituting the wafer 10, it is preferable that the alignment unit 88 includes an infrared (IR) ray applying unit adapted to apply IR rays, an optical system adapted to capture the IR rays applied by the IR ray applying unit, and an imaging element (IR CCD) adapted to output an electrical signal corresponding to the IR rays captured by the optical system.

The chuck table 22 includes: a rectangular X-direction movable plate 30 placed on the base 21 such as to be movable in the X-direction indicated by arrow X in FIG. 2; a rectangular Y-direction movable plate 31 placed on the X-direction movable plate 30 such as to be movable in the Y-direction indicated by arrow Y in FIG. 2; a cylindrical support column 32 fixed to an upper surface of the Y-direction movable plate 31; and a rectangular cover plate 33 fixed to an upper end of the support column 32. On the cover plate 33, a chuck table 34 extending upward through a slot formed on the cover plate 33 is disposed. The chuck table 34 is configured to hold the circular workpiece and to be rotatable by a rotational driving unit (not depicted). At an upper surface of the chuck table 34, there is disposed a circular suction chuck 35 formed from a porous material and extending substantially horizontally. The suction chuck 35 is connected to suction means (not depicted) through a flow passage extending through the support column 32, and four clamps 36 are evenly arranged in the periphery of the suction chuck 35. The clamps 36 grasp the frame F holding the wafer 10 when the wafer 10 is fixed to the chuck table 34. The X-direction is the direction indicated by arrow X in FIG. 2, and the Y-direction is the direction which is indicated by arrow Y and which is orthogonal to the X-direction. A plane defined by the X-direction and the Y-direction is substantially horizontal.

The moving mechanism 23 includes an X-direction moving mechanism 50 and a Y-direction moving mechanism 52. The X-direction moving mechanism 50 converts a rotational motion of a motor 50a into a rectilinear motion and transmits the rectilinear motion to the X-direction movable plate 30 through a ball screw 50b, thereby causing the X-direction movable plate 30 to advance or retract in the X-direction along guide rails 27 on the base 21. The Y-direction moving mechanism 52 converts a rotational motion of a motor 52a into a rectilinear motion and transmits the rectilinear motion to the Y-direction movable plate 31 through a ball screw 52b, thereby causing the Y-direction movable plate 31 to advance or retract in the Y-direction along guide rails 37 on the X-direction movable plate 30. Note that while illustration is omitted, the X-direction moving mechanism 50 and the Y-direction moving mechanism 52 are equipped with respective position detecting means, whereby the X-directional position, the Y-directional position and the circumferential directional rotational position of the chuck table 34 are accurately detected, and, when the X-direction moving mechanism 50, the Y-direction moving mechanism 52 and the rotational driving unit (not depicted) are driven, the chuck table 34 can thereby be accurately position at an arbitrary position and at an arbitrary angle. The X-direction moving mechanism 50 serves as a processing feeding unit for moving the chuck table 22 in a processing feeding direction, and the Y-direction moving mechanism 52 serves as an indexing feeding unit for moving the chuck table 22 in an indexing feeding direction.

Referring to FIGS. 1 to 3B, the liquid supply mechanism 4 will be described. As illustrated in FIG. 1, the liquid supply mechanism 4 includes a liquid jetting apparatus 40, a liquid supply pump 44, a filter 45, a liquid recovery pool 60, a pipe 46a for connecting the liquid jetting apparatus 40 and the liquid supply pump 44, and a pipe 46b for connecting the liquid recovery pool 60 and the filter 45. Note that the both pipe 46a and pipe 46b are preferably composed of a flexible hose, partly or in its entirety.

Figure 3A:
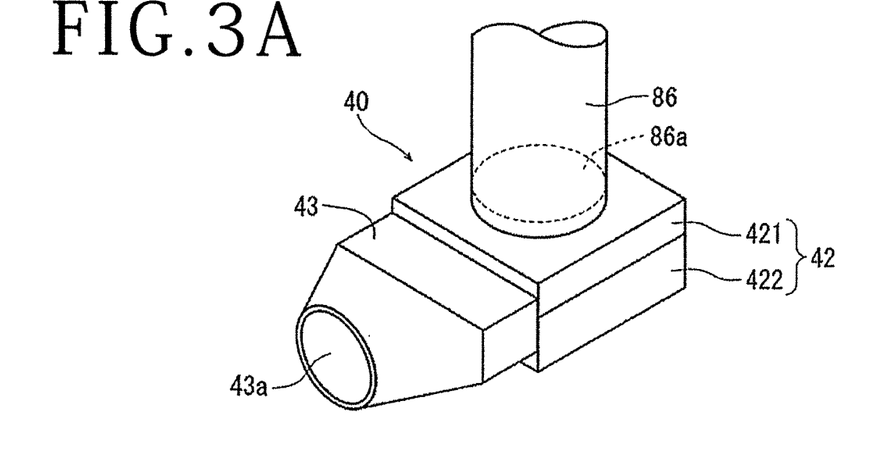
FIG. 3A is a perspective view of a liquid jetting apparatus mounted to the laser processing apparatus depicted in FIG. 1.
Figure 3B:
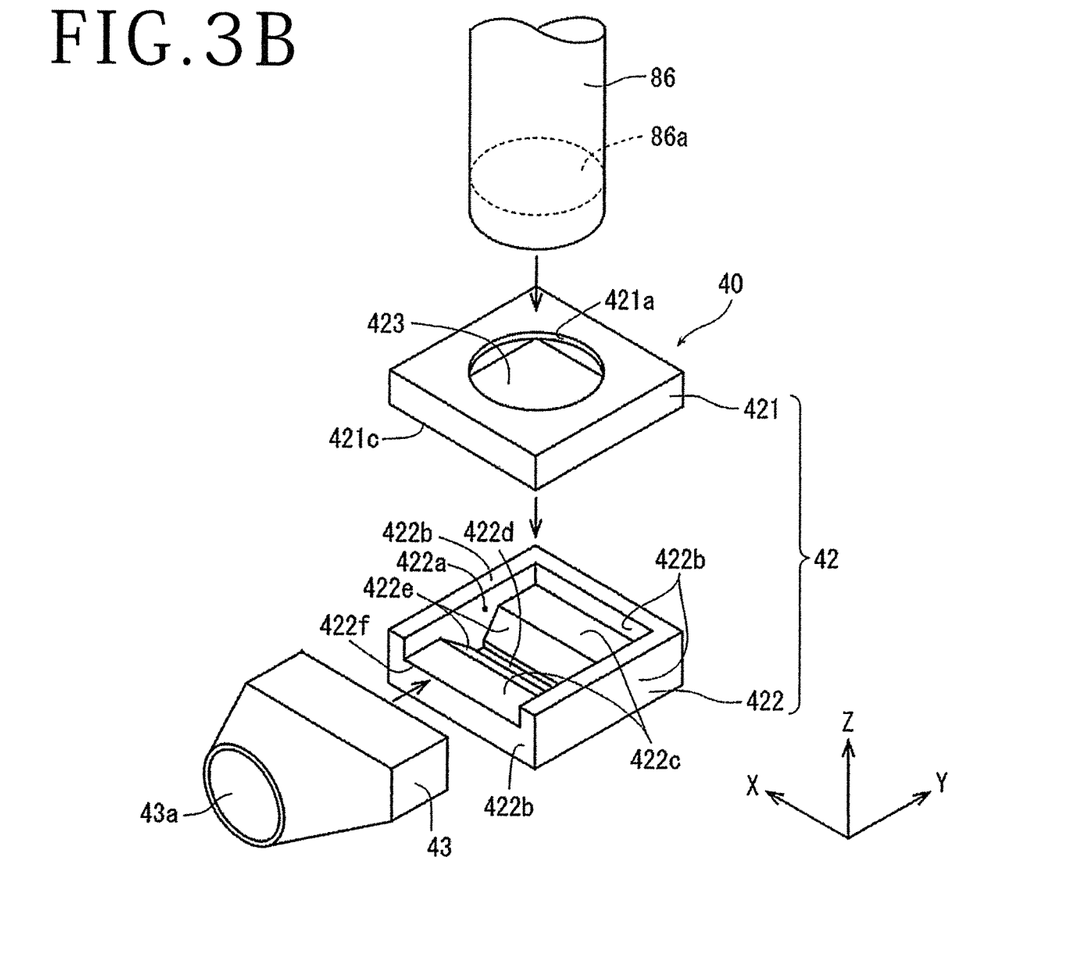
FIG. 3B is an exploded perspective view of the liquid jetting apparatus.

As depicted in FIG. 3A, the liquid jetting apparatus 40 is disposed at a lower end portion of the condenser 86. An exploded perspective view of the liquid jetting apparatus 40 is depicted in FIG. 3B. As is seen from FIG. 3B, the liquid jetting apparatus 40 is composed of a casing 42 and a liquid supply section 43. The casing 42 is substantially rectangular in plan view, and is composed of a casing upper member 421 and a casing lower member 422. The casing upper member 421 is formed in a central portion of an upper surface thereof with a circular opening 421a for connection with the condenser 86. In addition, at a lower surface 421c of the casing upper member 421, there is disposed a transparent plate 423 through which a laser beam LB applied from the condenser 86 is transmitted. The transparent plate 423 is composed, for example, of a glass plate, and is disposed at such a position as to close the lower surface 421c side of the casing upper member 421 and to face the opening 421a. The casing lower member 422 has side walls 422b and a bottom wall 422c. A space 422a is defined inside the casing lower member 422 by the side walls 422b and the bottom wall 422c. The bottom wall 422c is formed with an opening 422d extending in the X-direction indicated by arrow X in the figure, in the center thereof, and inclined portions 422e formed along both sides in the longitudinal direction of the opening 422d. The width of the opening 422d is set to be approximately 1 to 2 mm. The side wall 422b on the viewer's side in the Y-direction indicated by arrow Y, where the liquid supply section 43 is connected, is formed with a liquid supply port 422f. The casing upper member 421 and the casing lower member 422 are coupled together from the upper and lower sides, whereby the casing 42 is configured which is provided with the space 422a defined by a ceiling wall composed of the transparent plate 48, the side walls 422b, and the bottom wall 422c.

The liquid supply section 43 includes a supply port 43a supplied with a liquid W, a discharge port (not depicted) formed at such a position as to face the liquid supply port 422f formed in the casing 42, and a communication passage (not depicted) providing communication between the supply port 43a and the discharge port. The liquid supply section 43 is assembled onto the casing 42 from the Y-direction, whereby the liquid jetting apparatus 40 is formed.

With the liquid jetting apparatus 40 being configured as above-mentioned, the liquid W discharged from the liquid supply pump 44 is supplied to the supply port 43a of the liquid supply section 43, is then supplied to the liquid supply port 422f of the casing 42 through the communication passage inside the liquid supply section 43 and the discharge port, and is jetted from the opening 422d formed in the bottom wall 422c after passing through the space 422a inside the casing 42. As depicted in FIG. 1, the liquid jetting apparatus 40 is attached to a lower end portion of the condenser 86 in such a manner that the liquid supply section 43 and the casing 42 are aligned in the Y-direction. As a result, the opening 422d formed in the bottom wall 422c of the casing 42 is positioned such as to extend in the X-direction, which is the processing feeding direction.

Returning to FIGS. 1 and 2, the liquid recovery pool 60 will be described. As depicted in FIG. 2, the liquid recovery pool 60 includes an outer frame body 61 and two waterproof covers 66.

The outer frame body 61 includes: outer walls 62a extending in the X-direction indicated by arrow X in the figure; outer walls 62b extending in the Y-direction indicated by arrow Y in the figure; inner walls 63a and 63b disposed in parallel to the outer walls 62a and 62b on the inner sides of the outer walls 62a and 62b with a predetermined interval therebetween; and a bottom wall 64 connecting lower edges of the outer walls 62a and 62b, and the inner walls 63a and 63b. The outer walls 62a and 62b, the inner walls 63a and 63b, and the bottom wall 64 define a rectangular liquid recovery passage 70 of which the longitudinal direction is along the X-direction and the transverse direction is along the Y-direction. An opening 60A penetrating in the vertical direction is formed on the inner side of the inner walls 63a and 63b constituting the liquid recovery passage 70. The bottom wall 64 constituting the liquid recovery passage 70 is provided with slight inclinations in the X-direction and the Y-direction, and a liquid discharge hole 65 is disposed at a corner portion (a corner portion on the left side in the figure) corresponding to a lowermost position of the liquid recovery passage 70. The pipe 46b is connected to the liquid discharge hole 65, and the liquid discharge hole 65 is connected to the filter 45 through the pipe 46b. Note that the outer frame body 61 is preferably formed from a stainless steel plate material which is highly resistant to corrosion and rusting.

Each of the two waterproof covers 66 includes two gate-shaped metallic fixtures 66a, and a resin-made cover member 66b which is bellows-like in shape and is waterproof. The metallic fixtures 66a are formed in such a size as to be able to straddle the two inner walls 63a disposed in the manner of facing each other in the Y-direction of the outer frame body 61, and are attached to both end portions of the cover member 66b. One of the metallic fixtures 66a of each of the two waterproof covers 66 is fixed to each of the inner walls 63b disposed in the manner of facing each other in the X-direction of the outer frame body 61. The liquid recovery pool 60 configured in this way is fixed on the base 21 of the laser processing apparatus 2 by fixtures (not depicted). The cover plate 33 of the chuck table 22 is mounted in the manner of being clamped between the metallic fixtures 66a of the two waterproof covers 66. Note that end faces in regard of the X-direction of the cover member 33 are in the same gate shape as that of the metallic fixtures 66a, and are sized such as to straddle the facing inner walls 63a of the outer frame body 61, like the metallic fixtures 66a; therefore, the cover member 33 is attached to the waterproof covers 66 after the outer frame body 61 of the liquid recovery pool 60 is disposed on the base 21. According to the configuration as above-mentioned, when the cover plate 33 is moved in the X-direction by the X-direction moving mechanism 50, the cover plate 33 is moved along the inner walls 63a of the liquid recovery pool 60. Note that the method of attaching the waterproof cover 66 and the cover member 33 is not limited to the above-mentioned procedure; for example, a method may be adopted wherein the cover member 33 is preliminarily attached before attaching the two waterproof covers 66 to the inner walls 63b of the outer frame body 61, and the waterproof coves 66 are attached to the outer frame body 61 which is mounted to the base 21 precedingly.

Returning to FIG. 1 for continuing the description, with the liquid supply mechanism 4 being configured as above-mentioned, the liquid W discharged from the discharge port 44a of the liquid supply pump 44 is supplied to the liquid jetting apparatus 40 through the pipe 46a. The liquid W supplied to the liquid jetting apparatus 40 is jetted downward through the opening 422d formed in the bottom wall of the casing 42 of the liquid jetting apparatus 40. The liquid W jetted from the liquid jetting apparatus 40 is recovered by the liquid recovery pool 60. The liquid W recovered by the liquid recovery pool 60 flows through the liquid recovery passage 70, and is collected into the liquid discharge hole 65 provided at the lowermost position of the liquid recovery passage 70. The liquid W collected into the liquid discharge hole 65 is led through the pipe 46b to the filter 45, where laser processing swarf (debris) and dust and the like are removed, and the liquid W is returned to the liquid supply pump 44. In this way, the liquid W discharged by the liquid supply pump 44 is circulated in the liquid supply mechanism 4.

Figure 4:
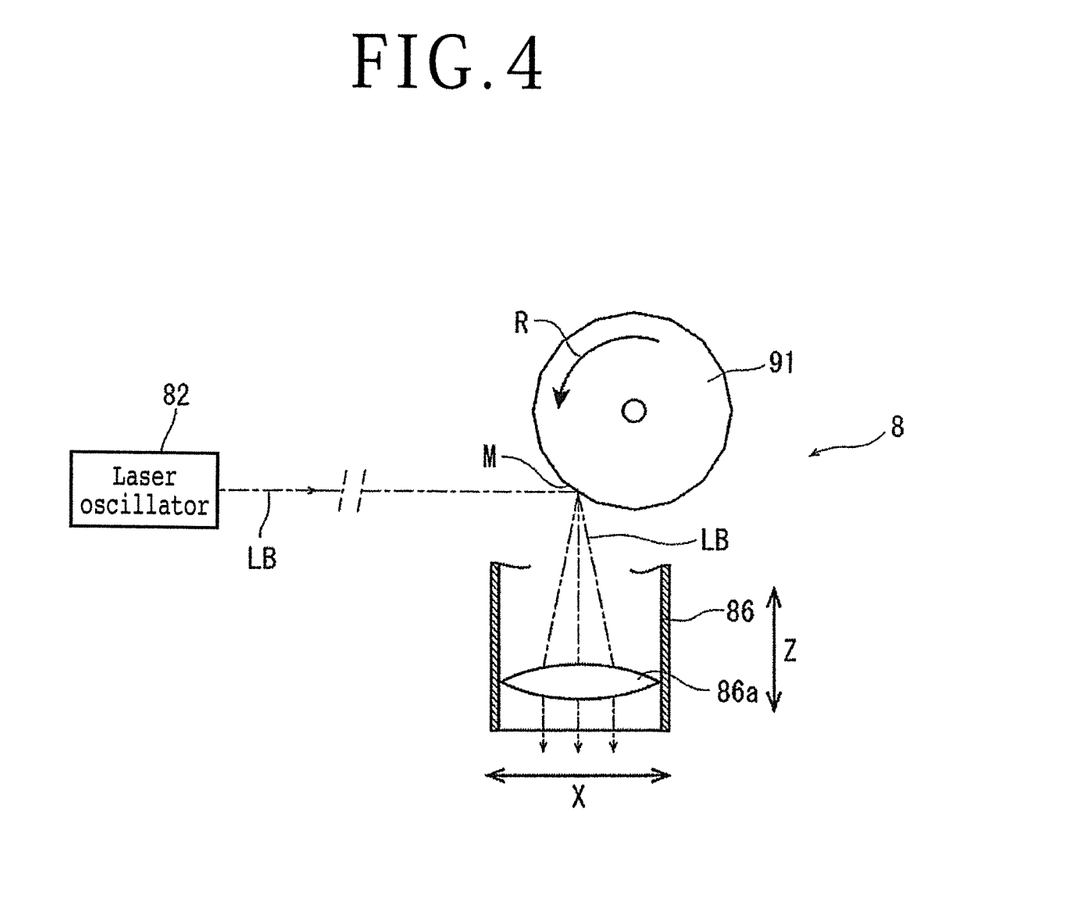
FIG. 4 is a block diagram for explaining an optical system of a laser beam applying unit mounted to the laser processing apparatus depicted in FIG. 1.

FIG. 4 is a block diagram depicting generally the optical system of the laser beam applying unit 8. As depicted in FIG. 4, the laser beam applying unit 8 includes: a laser oscillator 82 adapted to oscillate a pulsed laser beam LB; an attenuator (omitted in illustration) adapted to control the output of the laser beam LB oscillated by the laser oscillator 82; a reflection mirror (omitted in illustration) adapted to appropriately change the optical path of the laser beam LB oscillated from the laser oscillator 82; a polygon mirror 91 as a dispersing unit for dispersing the application direction of the laser beam LB; and the condenser 86. The laser oscillator 82 oscillates, for example, a laser beam LB of such a wavelength as to be absorbed in the workpiece.

The polygon mirror 91 disposed at an upper portion of the condenser 86 is provided with a motor (not depicted) for rotating the polygon mirror 91 at a high speed in a direction indicated by arrow R. Inside the condenser 86, there is disposed a focusing lens (fθ lens) 86a adapted to focus the laser beam LB and thereby to apply the laser beam LB to the workpiece. As depicted in the figure, the polygon mirror 91 has a plurality of mirrors M arranged concentrically with respect to a rotational axis of the polygon mirror 91. The fθ lens 86a is positioned under the polygon mirror 91, and functions to focus the laser beam LB reflected by the polygon mirror 91 and to apply the laser beam LB to the wafer 10 on the chuck table 34. With the polygon mirror 91 rotated, the angle of the laser beam LB reflected by the mirrors M is varied in a predetermined range, whereby the laser beam LB is applied while being dispersed within a predetermined range in the processing feeding direction (X-direction) on the wafer 10.

Further, the laser beam applying unit 8 includes a focal point position control unit (not depicted). While illustration of the specific configuration of the focal point position control unit is omitted, for example, a configuration may be adopted which includes a ball screw extending in the Z-direction and having a nut section fixed to the condenser 86, and a motor connected to an end portion of the ball screw. According to such a configuration, a rotational motion of the motor is converted into a rectilinear motion, and the condenser 86 is moved along guide rails (omitted in illustration) disposed in the Z-direction, whereby the position, in the Z-direction indicated by arrow Z, of the focal point of the laser beam LB focused by the condenser 86 is controlled.

Returning to FIG. 1 for continuing the description, on the lower surface of the tip portion of the horizontal wall section 262, the alignment unit 88 is disposed together with the condenser 86 and with a spacing from the condenser 86 in the X-direction. The alignment unit 88 is utilized for imaging the workpiece held by the holding table 32, detecting a region to be laser processed, and aligning the condenser 86 with a processing position of the wafer 10.

The laser processing apparatus 2 of the present invention is generally configured as above-mentioned, and an operation thereof will be described below. In performing laser processing by the laser processing apparatus 2 in the present embodiment, the plate-shaped workpiece, for example, the wafer 10 formed from silicon (Si) and formed with devices on a front surface thereof, which is supported by the annular frame F through the adhesive tape T is prepared. After the wafer 10 is prepared, the wafer 10 is placed on the suction chuck 35 of the chuck table 34 depicted in FIG. 1, in a state in which the front surface thereof formed with the devices is on the upper side, and the wafer 10 is fixed by the clamps 36 or the like. After the wafer 10 is fixed on the suction chuck 35, a suction source (not depicted) is operated, to generate a suction force on the suction chuck 35, whereby the wafer 10 is held by suction.

Figure 5A:
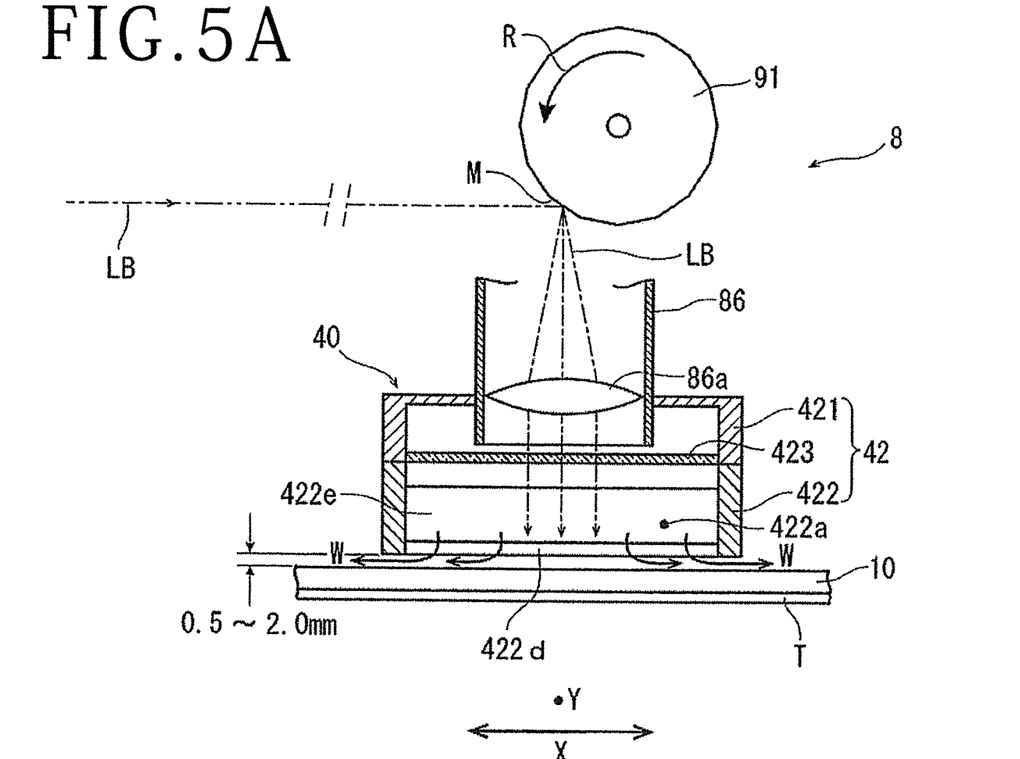
FIG. 5A is an X-direction partial enlarged sectional view at the time of operating the liquid jetting apparatus mounted to the laser processing apparatus depicted in FIG. 1.

After the wafer 10 is held by the suction chuck 35, the chuck table 34 is moved appropriately in the X-direction and the Y-direction by the moving mechanism 23, and the wafer 10 on the chuck table 34 is thereby positioned at a position beneath the alignment unit 88. After the wafer 10 is positioned beneath the alignment unit 88, an upper surface of the wafer 10 is imaged by the alignment unit 88. Next, based on the image of the wafer 10 picked up by the alignment unit 88, alignment between the wafer 10 and the condenser 86 is performed by such a technique as pattern matching. Based on position information obtained by the alignment, the chuck table 34 is moved, whereby the condenser 86 is positioned at a position on the upper side of a processing starting position on the wafer 10. Subsequently, the condenser 86 is moved in the Z-direction by the focal point position control unit (not depicted), whereby the focal point is positioned at a surface level of one end portion of the division line which is a starting position for application of the laser beam LB on the wafer 10. As illustrated in FIG. 5A, the liquid jetting apparatus 40 of the liquid supply mechanism 4 is disposed at the lower end portion of the condenser 86, and such a setting is made that when the focal point is position at the height of the front surface of the wafer 10, a gap of approximately 0.5 to 2.0 mm, for example, is formed between a lower surface of the casing lower member 422 constituting the liquid jetting apparatus 40 and the front surface of the wafer 10.

After the alignment between the condenser 86 and the wafer 10 is performed by the alignment unit 88, a sufficient quantity of the liquid W is supplemented to the liquid supply mechanism 4 through the liquid recovery passage 70 of the liquid recovery pool 60, and the liquid supply pump 44 is operated. As the liquid W circulated in the inside of the liquid supply mechanism 4, there is used, for example, pure water.

With the liquid supply mechanism 4 configured as above-mentioned, the liquid W discharged from the discharge port 44a of the liquid supply pump 44 is supplied to the liquid jetting apparatus 40 through the pipe 46a. The liquid W supplied to the liquid jetting apparatus 40 is jetted downward through the opening formed in the bottom wall of the liquid jetting apparatus 40. The liquid W jetted from the liquid jetting apparatus 40 is recovered by the liquid recovery pool 60. The liquid W recovered by the liquid recovery pool 60 flows through the liquid recovery passage 70, to be collected into the liquid discharge hole 65 provided at the lowermost position of the liquid recovery passage 70. The liquid W collected in the liquid discharge hole 65 is led through the pipe 46b to the filter 45, where the liquid W is clarified, and is returned to the liquid supply pump 44. In this way, the liquid W discharged by the liquid supply pump 44 is circulated in the liquid supply mechanism 4.

With the lapse of a predetermined time (approximately several minutes) after the start of an operation of the liquid supply mechanism 4, a state results in which the inside of the liquid jetting apparatus 40 is filled up with the liquid W and the liquid W is stably circulated in the liquid supply mechanism 4.

In the state in which the liquid W is stably circulated by the liquid supply mechanism 4, the X-direction moving mechanism 50 is operated to move the chuck table 34 at a predetermined moving velocity in the processing feeding direction (X-direction), while operating the laser beam applying unit 8. In this instance, as depicted in FIG. 5A, the laser beam LB applied from the condenser 86 is transmitted through the transparent plate 423 of the liquid jetting apparatus 40 and the liquid W, to be applied to the wafer 10 through the opening 422d. In applying the laser beam LB to the wafer 10, as is seen from FIG. 5A, the positions of the mirrors M constituting the polygon mirror 91 are varied attendant on the rotation of the polygon mirror 91, whereby the laser beam LB is applied to the wafer 10 in a dispersed manner. After the laser beam LB is applied to a predetermined mirror M, the laser beam LB is applied to the next mirror M located on the downstream side with respect to the rotating direction R of the polygon mirror 91, whereby the laser beam LB is continuedly and dispersedly applied to the wafer 10. During when the laser beam LB is oscillated from the laser oscillator 82 and the polygon mirror 91 is rotated, such laser processing is repeated. Note that the number of sheets of the mirrors M constituting the polygon mirror 91, the rotational speed of the polygon mirror 91 and the like factors are appropriately determined according to the workpiece.

Note that the laser processing by the laser processing apparatus 2 as above may be carried out, for example, in the following processing conditions.

Figure 5B:
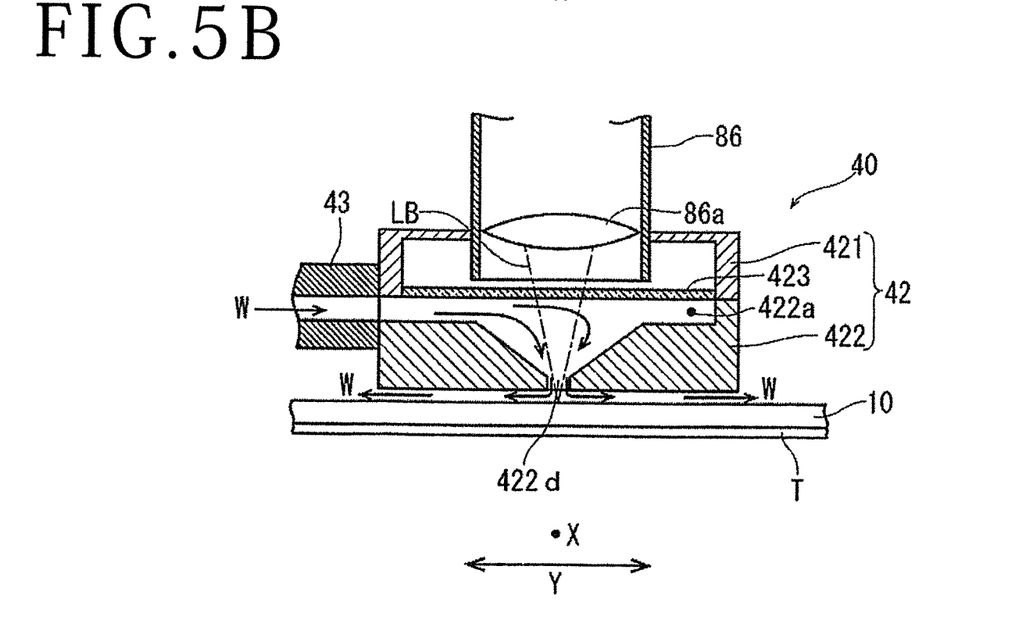
FIG. 5B is a Y-direction partial enlarged sectional view at the time of operating the liquid jetting apparatus.

Wavelength of laser beam: 226 nm, 355 nm, 532 nm, 1,064 nm
Average output: 10 to 100 W
Repetition frequency: 0 to 300 MHz
Pulse width: 50 fs to 1 ns
Processing feeding speed: 10 to 1,000 mm/s As illustrated in FIG. 5B, the laser beam LB is applied to the wafer 10 through the opening 422d formed in the bottom wall 422c of the casing 42. In this instance, the laser beam LB is applied while being dispersed in the processing feeding direction (the direction perpendicular to the paper surface, indicated by a black dot in FIG. 5B). The length in the longitudinal direction (X-direction) and the length in the transverse direction (Y-direction) of the opening 422d are so set as to permit passage therethrough of the laser beam applied dispersedly, along the processing feeding direction. As a result, the laser beam LB is not shielded when applied dispersedly along the direction in which the opening 422d extends, and ablation of the wafer 10 is performed. Here, from the liquid supply pump 44 in the present embodiment, the liquid W is discharged in such a quantity that the gap formed between the lower surface of the casing 42 of the liquid jetting apparatus 40 and the wafer 10 is always filled with the liquid W. As a result, as depicted in FIGS. 5A and 5B, the liquid W supplied from the liquid supply section 43 flows through the space 422a inside the casing 42, is discharged through the opening 422d onto the front surface of the wafer 10, and flows down.

When ablation is performed in the above-mentioned state, air bubbles are generated in the liquid W located at that position on the front surface of the wafer 10 to which the laser beam LB is applied. In connection with this, in the present embodiment, as illustrated in FIG. 5B, the liquid W is made to constantly flow at a predetermined flow velocity through the gap formed on the wafer 10. As a result, the air bubbles generated in the vicinity of the application position of the laser beam LB are swiftly removed to the exterior through the gap formed on the wafer 10. Therefore, in the case where the laser beam LB is applied to the wafer 10 in the dispersed manner by use of the polygon mirror 91, the laser beam LB can be applied to the wafer 10 while avoiding the air bubbles generated due to the ablation, and favorable ablation can be carried out continuedly. Further, according to the present embodiment, the liquid W flows continuedly through the gap on the wafer 10, whereby debris released into the liquid W is swiftly removed from the area on the wafer 10. As is seen from FIG. 1, the liquid W containing the air bubbles and the debris flows on the cover plate 33 and the waterproof covers 66, to be led into the liquid recovery passage 70. The liquid W led into the liquid recovery passage 70 flows through the liquid recovery passage 70 while releasing the air bubbles, generated due to ablation, to the exterior, and is discharged through the liquid discharge hole 65 formed at the lowermost potion of the liquid recovery passage 70. The liquid W discharged through the liquid discharge hole 65 is led to the filter 45 through the pipe 46b, and is again supplied to the liquid supply pump 44. The liquid W is circulated in the liquid supply mechanism 4 in this way, whereby the debris and dust and the like are appropriately trapped by the filter, and the liquid W is maintained in a clean state.

After the ablation is carried out for the predetermined division line, the moving mechanism 23 is operated to position the condenser 86 at one end portion of an unprocessed division line adjacent to the just-processed division line in the Y-direction, and the same laser processing as the above-mentioned ablation is conducted. After the ablation is performed for all the adjacent division lines, the chuck table 34 is rotated by 90 degrees, and the same ablation is performed for the unprocessed division lines orthogonal to the previously processed division lines in the predetermined direction. In this way, ablation can be carried out for all the division lines on the wafer 10.

According to the present embodiment, the laser beam LB is applied to the wafer 10 through the transparent plate 423 disposed in the liquid jetting apparatus 40 and the liquid W supplied to the liquid jetting apparatus 40, to perform laser processing, and the air bubbles generated from the front surface of the wafer 10 and the debris generated due to the laser processing and the like are swiftly removed together with the liquid W. As a result, the air bubbles generated from the front surface of the wafer 10 are prevented from hampering the laser processing, adhesion of debris to the devices after processing and the like troubles are prevented, and processing quality is prevented from being lowered.

While the transparent plate 423 has been composed of a glass plate in the above embodiment, this is not limitative. The transparent plate 423 need only be a transparent plate through which the laser beam LB is transmitted, and, for example, it may be a resin-made plate such as an acrylic resin plate.

While the laser beam LB applied from the laser oscillator 82 has been guided to the focusing lens 86 while being dispersed by the polygon mirror 91 in the above embodiment, this configuration is not restrictive. A reflection mirror or mirrors disposed fixedly may be used in place of the polygon mirror 91. Further, while an example in which the laser processing applied to the wafer 10 is ablation has been depicted in the above embodiment, the laser processing may be a processing of forming modified layers in the inside of a workpiece (for example, the laser processing described in Japanese Patent No. 3408805) or a processing of forming so-called shield tunnels (for example, the laser processing described in Japanese Patent Laid-open No. 2014-221483).

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus comprising:

a chuck table adapted to hold a plate-shaped workpiece;

a laser beam applying unit adapted to apply a laser beam to the workpiece held by the chuck table to process the workpiece; and a processing feeding unit adapted to putting the chuck table and the laser beam applying unit into relative processing feeding, wherein the laser beam applying unit includes a laser oscillator adapted to emit a laser beam, a condenser adapted to focus the laser beam emitted from the laser oscillator and to thereby apply the laser beam to the workpiece held by the chuck table, and a liquid jetting apparatus disposed at a lower end portion of the condenser and adapted to jet a liquid to an upper surface of the workpiece, the liquid jetting apparatus includes a transparent plate disposed at the lower end portion of the condenser and permitting transmission therethrough of the laser beam, a casing provided with a space defined by a ceiling wall composed of the transparent plate, side walls, and a bottom wall, an opening formed in the bottom wall, extending in a processing feeding direction, and permitting passage therethrough of the laser beam focused by the condenser, and a liquid supply section adapted to supply the liquid to the casing, and the liquid is jetted through the opening formed in the bottom wall to the workpiece and the laser beam is applied to the workpiece.

2. The laser processing apparatus according to claim 1, wherein the laser beam applying unit further includes dispersing means dispersing the laser beam in the processing feeding direction.

3. The laser processing apparatus according to claim 1, wherein a lower surface of the bottom wall of the casing is positioned above the upper surface of the workpiece to define a gap therebetween.

4. The laser processing apparatus according to claim 3, wherein the gap is between 0.5 mm and 2.0 mm.

5. The laser processing apparatus according to claim 1, wherein the bottom wall includes a pair of inclined portions adjacent to the opening.

6. The laser processing apparatus according to claim 5, wherein a first one of said pair of inclined portions is located on a first side of the opening and a second one of said pair of inclined portions is located on a second side of the opening.

7. The laser processing apparatus according to claim 6, wherein said pair of inclined portions are configured and arranged to direct the liquid towards the hole.

8. The laser processing apparatus according to claim 1, wherein the bottom wall is configured and arranged to be positioned above the upper surface of the workpiece.

* * * * *